United States Patent [19]

Hirakawa

[11] Patent Number: 5,065,210

[45] Date of Patent: Nov. 12, 1991

[54] LATERAL TRANSISTOR STRUCTURE FOR BIPOLAR SEMICONDUCTOR INTEGRATED CIRCUITS

[75] Inventor: Kenji Hirakawa, Yokohama, Japan

[73] Assignee: Kabushiki Kaisha Toshiba, Kawasaki, Japan

[21] Appl. No.: 548,609

[22] Filed: Jul. 5, 1990

[30] Foreign Application Priority Data

Jul. 7, 1989 [JP] Japan ................................. 1-176236

[51] Int. Cl.$^5$ ..................... H01L 29/72; H01L 29/06; H01L 29/04; H01L 23/48
[52] U.S. Cl. ......................................... 357/35; 357/34; 357/56; 357/59; 357/68
[58] Field of Search ....................... 357/34, 35, 56, 59, 357/68

[56] References Cited

U.S. PATENT DOCUMENTS

| 4,688,073 | 8/1987 | Goth et al. | 357/35 |
| 4,738,624 | 4/1988 | Iyer et al. | 357/34 |
| 4,764,799 | 8/1988 | Malaviya | 357/34 |

FOREIGN PATENT DOCUMENTS

| 0306213 | 3/1989 | European Pat. Off. | 357/34 |
| 0309772 | 4/1989 | European Pat. Off. | 357/34 |
| 63-289863 | 11/1988 | Japan | 357/34 |
| 63-292673 | 11/1988 | Japan | 357/35 |
| 63-302556 | 12/1988 | Japan | 357/34 |
| 1241167 | 9/1989 | Japan | 357/35 |

OTHER PUBLICATIONS

A. W. Wieder, "Processing for a Lateral PNP Transistor in the Submicron Range", IBM Technical Disclosure Bulletin, vol. 21, No. 10, Mar. 1979, pp. 4050–4052.
"Improved Base Contact for Collapsor Device", IBM Technical Disclosure Bulletin, vol. 32, No. 6A, Nov. 1989, pp. 49–51.

Primary Examiner—Andrew J. James
Assistant Examiner—Cynthia S. Deal
Attorney, Agent, or Firm—Finnegan, Henderson, Farabow, Garrett, and Dunner

[57] ABSTRACT

A lateral transistor with a fine structure includes a semiconductor substrate of one conductivity type on which a mesa-shaped projection of opposite conductivity type is provided. The projection has side walls opposed to each other and serves as a collector region. A base region of one conductivity type is provided in one side wall of the projection, while a collector contact region is provided in the other side wall thereof. An emitter region of opposite conductivity type is also formed in the base region. A base contact layer of polysilicon is provided on a field oxide layer and is in contact with the base region at the edge. In the same manner, a collector contact layer of polysilicon provided on the field oxide layer is in contact with the collector contact region at the edge.

15 Claims, 4 Drawing Sheets

LATERAL TRANSISTOR STRUCTURE FOR BIPOLAR SEMICONDUCTOR INTEGRATED CIRCUITS

BACKGROUND OF THE INVENTION

1. Field of the Invention

The present invention relates to a lateral transistor and a method of making the same, and more particularly, to a lateral transistor used in a bipolar semiconductor integrated circuit device suitable for a high-speed logic operation circuit or an analog operation circuit in a high frequency region.

2. Description of the Prior Art

With development of fine pattern technology, an integration density of a bipolar semiconductor integrated circuit has been increased, and its parasitic elements have decreased to provide a high-speed operation.

In order to reduce dimensions of base and emitter regions to eliminate a capacitance between base and collector regions and unwanted parasitic components such as a base resistance, a transistor for bipolar semiconductor circuits having a structure shown in FIGS. 3 and 4 has been proposed.

FIG. 3 shows a bipolar transistor having an isolation layer of an oxide film. An N+-type buried region 31 is selectively formed in a P⁻-type semiconductor substrate 30, and an N⁻-type epitaxial layer 32 is grown on the substrate surface. After an oxide film (not shown) is formed on the surface of the epitaxial layer 32, a P+-type channel stopper 33 is provided at a predetermined position. Using LOCOS (Local Oxidation of Silicon) techniques, a field oxide film 34 is provided to surround the N+-type buried region 31 formed in the P⁻-type semiconductor 30, and a region isolation oxide film is formed in the N+-type buried region 31 through the N⁻-type epitaxial layer 32. Thereafter, a bipolar transistor having a P-type base region 35 and an N+-type emitter region 36 is provided in one epitaxial layer 32 serving as a collector region, and an N+-type collector contact layer is formed in the other epitaxial layer.

FIG. 4 shows a bipolar transistor having a trench isolation layer. After an N+-type buried region 41 is formed in a P⁻-type semiconductor substrate 40, an N⁻-type epitaxial layer 42 is grown on the surface of the P⁻-type semiconductor substrate 40. A trench 44 is provided by means of RIE (Reactive Ion Etching) techniques so as to reach the semiconductor substrate 40 through the epitaxial layer 42 and the buried region 41. A P-type impurity is introduced into the bottom of the semiconductor substrate 40 exposed by the trench 44 so as to form a P+-type channel stopper 43 having a high impurity concentration, and the trench 44 is filled with a desired insulator 46 through an oxide film 45. After a field oxide film 47 is formed on the substrate surface by known techniques, a doped polysilicon layer 48 serving as a base contact layer is deposited on the substrate surface. P-type impurity is then diffused in the epitaxial layer 42 to provide a P-type base region 49. The semiconductor substrate is subjected to an oxidation treatment to form an oxide film 51 thereon. Openings are then formed in the oxide film 51. An N+-type emitter region 50 and an N+-type collector contact layer 52 are formed in the P-type base region 49 and the N⁻-type epitaxial layer 42, respectively, by impurity diffusion from a doped polysilicon layer 53 deposited on the oxide film 51. Thereafter, an emitter electrode 54, a base electrode 55, and a collector electrode 56 are provided on the corresponding polysilicon layers to complete a bipolar transistor.

In the bipolar transistor having the structure shown in FIGS. 3 and 4, it is possible to decrease the dimensions or size of the field oxide isolation region and base and emitter regions. However, since the collector structure employs the thickness direction of the semiconductor substrate which includes the low impurity concentration region, the buried region and the contact region, it is difficult to reduce the dimensions thereof. In addition, it is difficult to decrease the collector series resistance and the parasitic capacitance between the collector region and the semiconductor substrate.

SUMMARY OF THE INVENTION

Therefore, it is an object of the present invention to provide a lateral transistor with a fine structure for bipolar semiconductor integrated circuits for reducing unwanted parasitic components or capacitances to achieve a high speed operation.

It is another object of the present invention to provide a method of making a lateral transistor with a fine structure for bipolar semiconductor integrated circuits.

According to one aspect of the present invention, a mesa-shaped projection of opposite conductivity type having flat side walls opposed to each other and serving as a collector region is provided on a semiconductor substrate of one conductivity type. A base region of one conductivity type is formed in one side wall of the mesa-shaped projection, while a collector contact region of opposite conductivity type is formed in the other side wall. An emitter region of opposite conductivity type is formed in the base region. Contact layers of doped polysilicon are connected to the base region and the collector contact region, respectively. These contact layers are extending on a field oxide layer formed on the semiconductor substrate so as to surround a pn junction intervened between the semiconductor substrate and the mesa-shaped projection.

According to another aspect of the present invention, there is provided a method of making the bipolar transistor for semiconductor integrated circuits according to a principle incorporated in the firstly referred aspect of the present invention.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings, in which:

DETAILED DESCRIPTION OF THE PREFERRED EMBODIMENT

Figure 1:
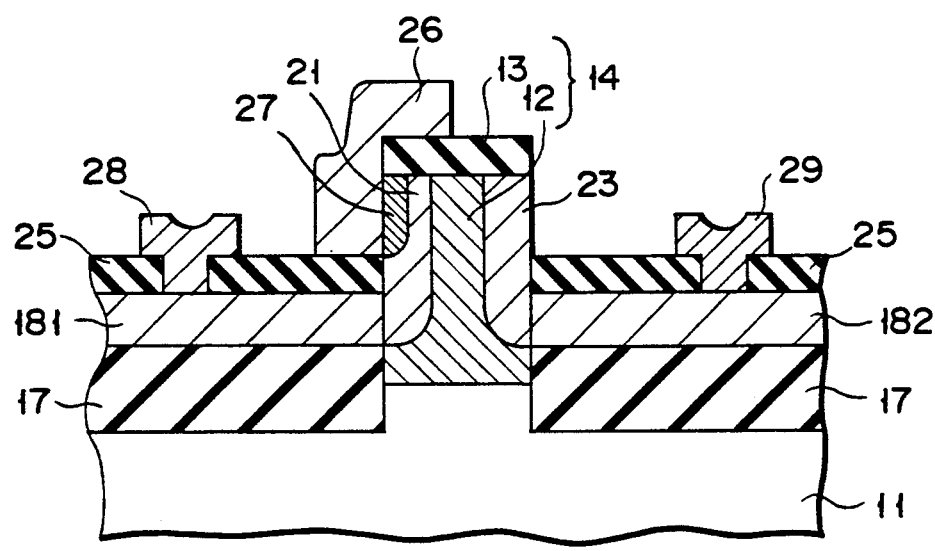
FIG. 1 is a sectional view schematically showing a lateral transistor for semiconductor integrated circuits according to an embodiment of the present invention.

FIG. 1 shows an NPN type lateral transistor for bipolar semiconductor integrated circuits according to an embodiment of the present invention.

Referring to FIG. 1, a P⁻-type silicon substrate 11 comprises a mesa-shaped projection 14 which includes an N-type layer 12 projected from the major surface of the substrate 11 of a lateral transistor and serving as a collector region and an oxide layer 13 provided on the top of the N-type layer 12. The mesa-shaped projection 14 has flat side walls opposed to each other and provides the lateral transistor a P-type base region 21 and an N-type emitter region 27, and an N⁺-type collector contact region 23, respectively. A field oxide layer 17 is in the P⁻-type substrate 11 so as to surround a pn junction between the N-type mesa-shaped projection 14 and the P⁻-type substrate 11. A polysilicon layer 181 doped with a P⁺-type impurity is provided on the field oxide layer 17 and connected to the side portion of the base region 21 to constitute a base contact layer, and a polysilicon layer 182 doped with an N⁺-type impurity is provided on the field oxide layer 17 and connected to the side portion of the collector contact region 23 to form a collector contact layer. An oxide film 25 is formed on the surfaces of the polysilicon layers 181 and 182, and base and collector electrodes 28 and 29 are provided through openings. An N⁺-type polysilicon layer 26 is deposited on one side wall of the mesa-shaped projection 14 so as to cover a part of the oxide layer 13 and the oxide layer 25, and an N-type emitter region 27 is produced by the impurity diffusion from the polysilicon layer 26. Note that the dimensions, e.g., the length and the width of the mesa-shaped projection 14 can be changed according to various characteristics such as current and voltage characteristics, the breakdown voltage of the bipolar transistor, and the like.

As has been described above, in the lateral transistor according to the preferred embodiment of the present invention, using the side walls of the mesa-shaped projection 14 opposed to each other, i.e., the side walls along a direction of thickness of the silicon substrate 11, the emitter region 27, base region 21, and collector contact region 23 are arranged in such a manner that most of the emitter/base junction, most of the base/collector junction and most of the collector contact surface ar substantially perpendicular to the silicon substrate 11. Accordingly, unwanted influence among transistors provided in the mesa-shaped projections can be prevented. Further, lateral transistors with the fine structure can be provided, thereby obtaining high density bipolar semiconductor integrated circuits. In addition, the collector series resistance and the parasitic capacitance between the collector region and the silicon substrate can be reduced to achieve the high speed operation.

A method of making the NPN type lateral transistor will be described below with reference to FIGS. 2A to 2H.

Figure 2A:
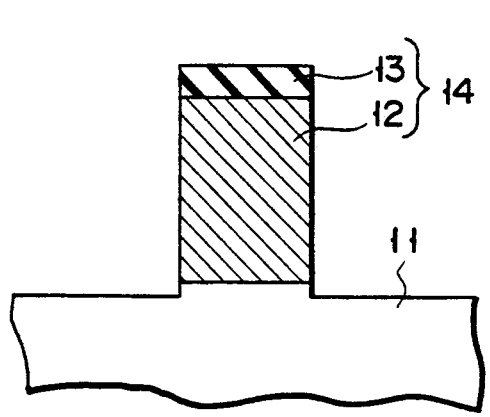
FIGS. 2A to 2H are sectional views schematically showing a fabrication process of the transistor shown in FIG. 1.

An N-type layer 12 serving as a collector region and having an impurity concentration of $10^{19-20}$ cm⁻³ is formed to a thickness of 1.0 μm on a P-type silicon substrate 11 having an impurity concentration of $10^{14-15}$ cm⁻³ by means of epitaxial growth or ion implantation techniques, and a silicon oxide layer 13 is formed on the surface of the N-type layer 12. The silicon oxide layer 13 is etched to a width of approximately 1 μm by means of lithography and RIE (Reactive Ion Etching) techniques. Using the silicon oxide layer 13 as a mask, the N-type layer 12 is selectively removed so as to reach the P-type substrate 11, thereby providing a mesa-shaped projection 14 including the N-type layer 12 and the silicon layer 13, as shown in FIG. 2A.

Figure 2B:
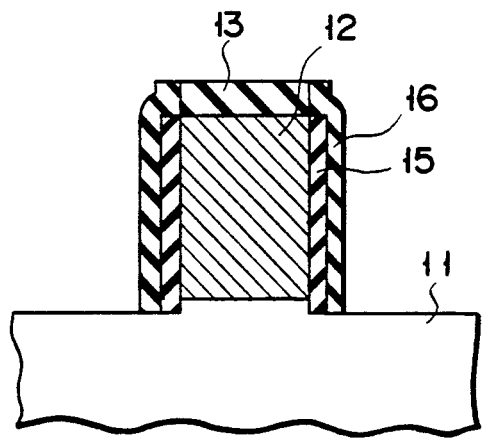
Figure 2C:
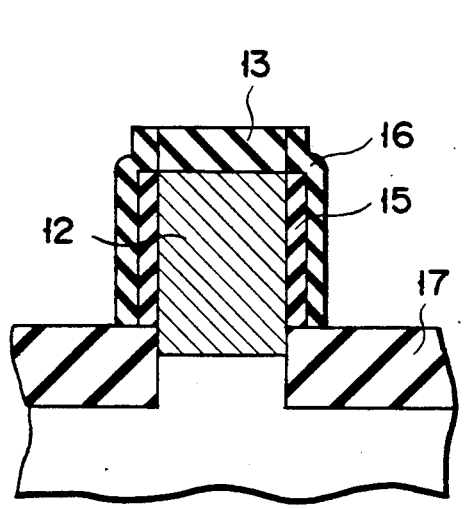

As shown in FIG. 2B, a silicon oxide layer 15 and a silicon nitride layer 16 are successively formed on both side walls of the mesa-shaped projection 14 along a thickness direction of the P-type silicon substrate 11. As shown in FIG. 2C, a field oxide layer 17 having a thickness of 3,000 to 5,000 Å is formed in the silicon substrate 11 so as to surround a pn junction between the silicon substrate 11 and the N-type layer 12.

Figure 2D:
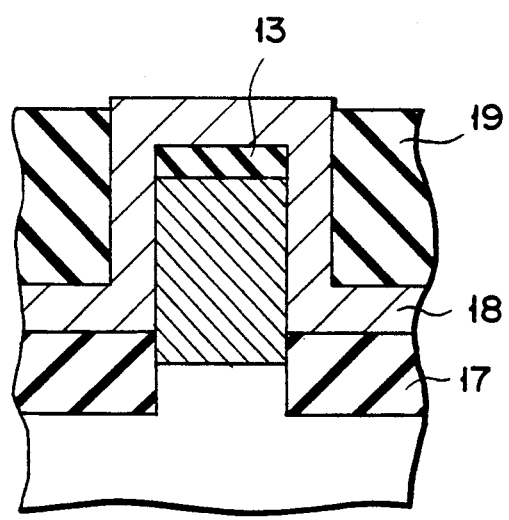

The silicon nitride layer 16 and the silicon oxide layer 15 are successively removed from the substrate surface. As shown in FIG. 2D, a non-doped polysilicon layer 18 is deposited on the substrate surface, and is coated with a resist layer 19. The resist layer 19 is etched until the surface of the mesa-shaped projection 14 is exposed. The exposed polysilicon layer 18 is selectively removed, leaving the polysilicon layer 18 on both side walls of the N-type layer 12 and on the field oxide layer 17.

Figure 2E:
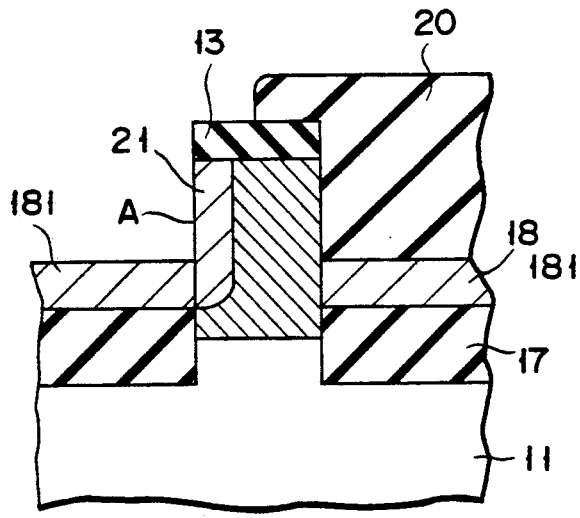

Thereafter, as shown in FIG. 2E, the right side portion of the substrate surface including the mesa-shaped projection 14 is masked with a resist layer 20, and a P-type impurity is ion-implanted into a side wall A of the mesa-shaped projection 14 from an oblique direction, thereby providing a P-type base region 21 having a depth of the order of 0.3 μm and a surface impurity concentration of the order of $10^{18}$ cm⁻³. At this time, the P-type impurity is also introduced into the polysilicon layer 18 to obtain the P-type polysilicon layer 181.

Figure 2F:
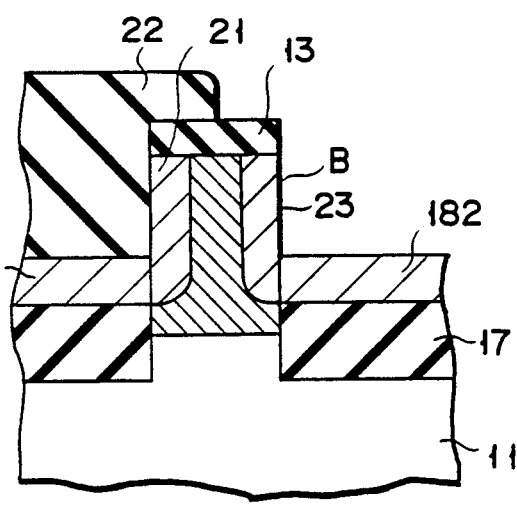

Furthermore, as shown in FIG. 2F, a left side portion of the substrate surface including the mesa-shaped projection 14 is covered with a resist layer 22, and an N-type impurity is ion-implanted into the side wall B of the mesa-shaped projection 14 from an oblique direction, thereby forming an N-type collector contact region 23 having a depth of the order of 0.3 μm and a surface impurity concentration of the order of $10^{19-20}$ cm⁻³. In this process, the N-type impurity is introduced into the polysilicon layer 18 to obtain the N-type polysilicon layer 182.

Figure 2G:
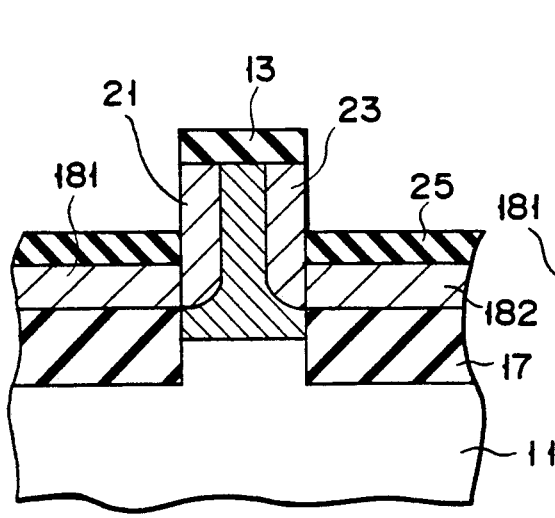

As shown in FIG. 2G, a silicon oxide layer 25 is formed on both the P-type polysilicon layer 181 and the N-type polysilicon layer 182 by thermal oxidation or CVD techniques. In this case, the side walls A and B of the mesa-shaped projection 14 are partially exposed by etchback techniques using a resist layer.

Figure 2H:
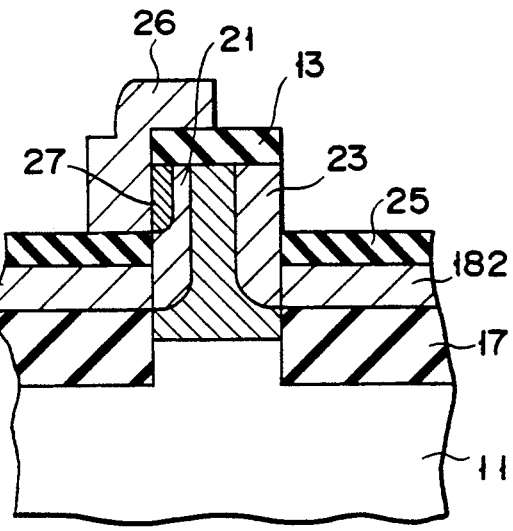
Figure 3:
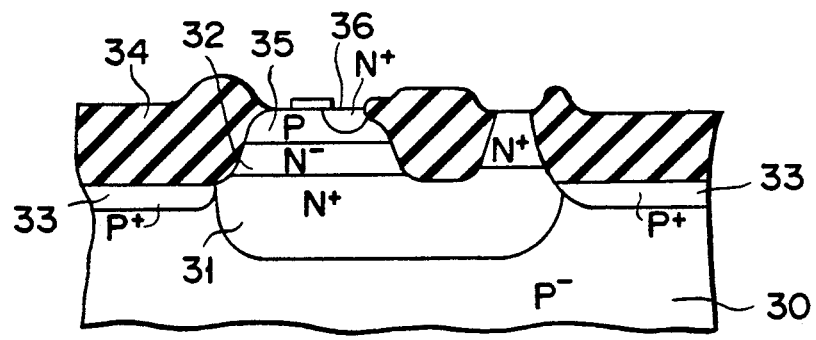
FIGS. 3 and 4 are sectional views showing conventional bipolar transistors for semiconductor integrated circuits.
Figure 4:
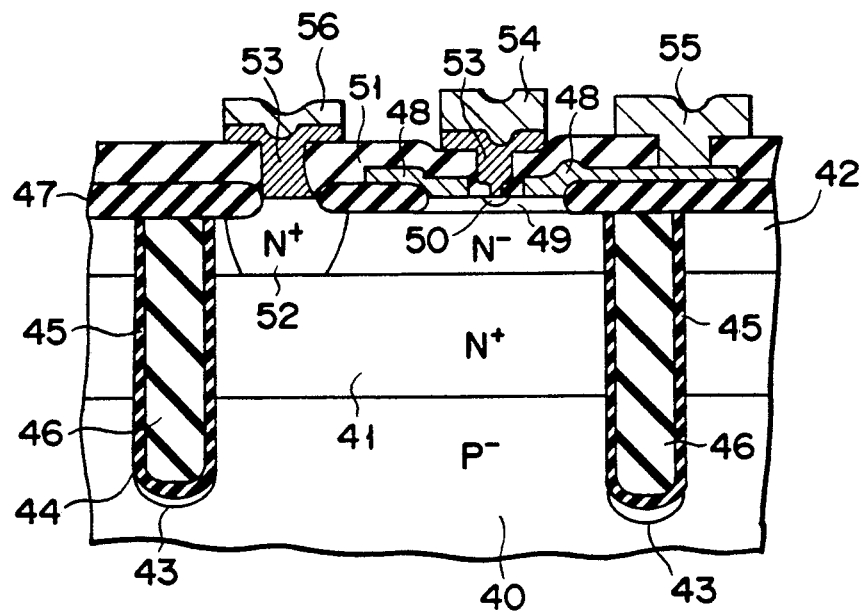

Thereafter, as shown in FIG. 2H, a polysilicon layer 26 containing an N-type impurity by an impurity concentration of approximately $10^{20}$ cm⁻³ is deposited so as to cover the exposed base region 21 and the silicon oxide layer 13 provided on the top of the mesa-shaped projection 14, and the N-type impurity is diffused into the base region 21 to form an emitter region 27 having a depth of approximately 0.1 μm. The polysilicon layer 26 is used as an emitter electrode. An electrode is provided by known techniques on the p-type and n-type polysilicon layers 181 and 182 connected to the p-type base region 21 and the n-type collector contact region 23, respectively. In addition, the substrate surface is desirably covered with a surface passivation layer composed of a PSG (Phosphor Silicate Glass) layer, a composite layer provided by the PSG layer and an SiN layer, and the like.

What is claimed is:

1. A lateral transistor comprising:
   a semiconductor substrate of a first conductivity type having a major surface,
   a mesa-shaped projection of a second conductivity type having a side wall at both sides thereof, said mesa-shaped projection being on said major surface of said semiconductor substrate and including a collector region,
   a base region of the first conductivity type, in one side wall of said mesa-shaped projection,
   an emitter region of the second conductivity type in said base region, and
   a collector contact region of the second conductivity type in the other side wall of said mesa-shaped projection.

2. The lateral transistor bipolar semiconductor according to claim 1, further including a pn junction between said semiconductor substrate and said mesa-shaped projection; and a field oxide layer, on said semiconductor substrate, surrounding the pn junction.

3. The lateral transistor bipolar semiconductor according to claim 2, wherein the base region include an edge, the collector contact region includes an edge, and the lateral transistor further includes a doped polycrystalline semiconductor layer of the first conductivity type, on said field oxide layer, in contact with the edge of the base region; and a doped polycrystalline semiconductor layer of the second conductivity type on said field oxide layer, in contact with the edge of the collector contact region.

4. The lateral transistor according to claim 1, wherein a top of said mesa-shaped projection is covered with a projection insulating layer.

5. The lateral transistor according to claim 3, further including a first insulating layer over the polycrystalline semiconductor layer of the first conductivity type; and a second insulating layer over the polycrystalline semiconductor layer of the second conductivity type.

6. The lateral transistor according to claim 5, further including a doped polycrystalline semiconductor layer of the second conductivity type on said emitter region so as to overlap said first insulating layer and said projection insulating layer.

7. The lateral transistor according to claim 1, further including an emitter-base junction, a base-collector junction, and a collector-collector contact interface, wherein most of the emitter-base junction, most of the base-collector junction and most of the collector-collector contact interface are substantially perpendicular to said semiconductor substrate.

8. A lateral transistor for a semiconductor integrated circuit comprising:
   a semiconductor substrate of a first conductivity type having a major surface;
   a mesa-shaped projection, on the major surface, of a second conductivity type having a first side wall and a second side wall opposing the first side wall, the mesa-shaped projection including a collector region;
   a base region of the first conductivity type in the first side wall;
   an emitter region of the second conductivity type in the base region;
   a collector contact region of the second conductivity type in the second side wall;
   a field oxide layer, in the semiconductor substrate, surrounding a part of the mesa-shaped projection;
   a first polycrystalline semiconductor layer of the first conductivity type on the field oxide layer and contacting an edge of the base region; and
   a second polycrystalline semiconductor layer of the second conductivity type on the field oxide layer and contacting an edge of the collector contact region.

9. The lateral transistor according to claim 8, further including a p-n junction between the semiconductor substrate and the mesa-shaped projection.

10. The lateral transistor according to claim 8, wherein the field oxide layer surrounds the pn junction.

11. The lateral transistor according to claim 8, wherein a top of the mesa-shaped projection is covered with a projection insulating layer.

12. The lateral transistor according to claim 8, further including a first insulating layer over the polycrystalline semiconductor layer of the first conductivity type; and a second insulating layer over the polycrystalline semiconductor layer of the second conductivity type.

13. The lateral transistor according to claim 11, wherein a doped polycrystalline semiconductor layer of the second conductivity type is on the emitter region to overlap the first insulating layer and the projection insulating layer.

14. The lateral transistor according to claim 8, further including a collector-collector contact interface wherein most of the collector-collector contact interface is substantially perpendicular to the semiconductor substrate.

15. The lateral transistor according to claim 14, further including an emitter-base junction and a base-collector junction, wherein most the emitter-base junction and most of the base-collector junction are substantially perpendicular to the semiconductor substrate.

* * * * *

UNITED STATES PATENT AND TRADEMARK OFFICE
CERTIFICATE OF CORRECTION

PATENT NO. : 5,065,210
DATED : November 12, 1991
INVENTOR(S) : Kenji Hirakawa

It is certified that error appears in the above-identified patent and that said Letters Patent is hereby corrected as shown below:

Claim 2, column 5, line 17, Delete "bipolar semiconductor"

Claim 3, column 5, line 23, Delete "bipolar semiconductor"

Claim 3, column 5, line 24, change "include"
to --includes--

Claim 15, column 6, line 50, after "most" insert --of--.

Signed and Sealed this

Twenty-second Day of June, 1993

Attest:

MICHAEL K. KIRK

Attesting Officer

Acting Commissioner of Patents and Trademarks